United States Patent [19]
Nashimoto

[11] Patent Number: 5,576,879
[45] Date of Patent: Nov. 19, 1996

[54] COMPOSITE OPTICAL MODULATOR

[75] Inventor: Keiichi Nashimoto, Minami-ashigara, Japan

[73] Assignee: Fuji Xerox Co., Ltd., Tokyo, Japan

[21] Appl. No.: 325,570

[22] Filed: Oct. 19, 1994

[30] Foreign Application Priority Data

Jan. 14, 1994 [JP] Japan ................................ 6-014968

[51] Int. Cl.$^6$ .......................................................... G02F 1/03
[52] U.S. Cl. .................................................. 359/248; 372/26
[58] Field of Search ..................................... 359/326, 328, 359/257, 251, 248; 385/2, 122; 257/77; 372/26

[56] References Cited

U.S. PATENT DOCUMENTS

| | | | |
|---|---|---|---|
| 4,243,300 | 1/1981 | Richards et al. | 350/150 |
| 4,730,326 | 3/1988 | Taneya et al. | 372/44 |
| 5,208,827 | 5/1993 | Sagawa et al. | 372/108 |
| 5,313,543 | 5/1994 | Matsuda et al. | 385/122 |
| 5,323,023 | 6/1994 | Fork | 505/235 |

FOREIGN PATENT DOCUMENTS

| | | |
|---|---|---|
| 61-185808 | 8/1986 | Japan . |
| 5-327034 | 12/1993 | Japan . |
| 6-151602 | 5/1994 | Japan . |
| 6-151601 | 5/1994 | Japan . |
| 6-196018 | 7/1994 | Japan . |

OTHER PUBLICATIONS

"Characteristics of peroidically domain–inverted LiNbO3 and LiTaO3 waveguides for second harmonic generation", K. Yamamoto et al., J. Appl. Phys. vol. 70 No. 4, Aug. 15, 1991, pp. 1947–1951.

"A Waveguide–Type Acousto–Optic Wide–Angle Deflector", Hatori et al., Miyanodal Technology Development Center, Fuji Photo Film Co., Ltd., pp. 9–15.

"Bragg A–O Deflector Using a Piezoelectric PLZT Thin Film", Adachi et al., Japanese Journal of Applied Physics, vol. 24 (1985) Supplement 24–2, pp. 287–289.

"Wide–Band Guided–Wave Acoustooptic Bragg Cells in GaAs–GaAlAs Waveguide", Lii et al., IEEE Journal of Quantum Electronics, vol. QE–22, No. 6, 1986, pp. 868–872.

"High Speed Optical TIR Switches Using PLZT Thin–Film Waveguides on Sapphire", Higashino et al., Jap.Journal of Appl. Physics, vol. 24 (1985), pp. 87–289.

"Optical TIR Switches Using PLZT Thin–Film Waveguides on Sapphire", Wasa et al., Journal of Lightwave Tech., vol. LT–2, No. 5, Oct. 1984, pp. 710–714.

"Growth of ceramic thin films on Si(100) using an in situ laser deposition technique", P. Tiwari et al., J. Appl. Phys. vol. 69 No. 12, Jun. 15, 1991, pp. 8358–8362.

Primary Examiner—Georgia Y. Epps
Assistant Examiner—Dawn-Marie Bey
Attorney, Agent, or Firm—Oliff & Berridge

[57] ABSTRACT

A composite optical modulator comprising a semiconductor laser having thereon an interposed buffer layer and an optical modulating device in this order, the optical modulating device comprising a thin ferroelectric lightguide film which is epitaxial or oriented with respect to a substrate of the semiconductor laser, the optical modulating device modulating a laser light launched from the semiconductor laser and thereafter emitting a modulated laser light.

12 Claims, 2 Drawing Sheets

COMPOSITE OPTICAL MODULATOR

FIELD OF THE INVENTION

This invention relates to a composite optical modulator comprising a semiconductor laser and an optical modulating device that has a ferroelectric thin-film lightguide and is epitaxial or oriented with respect to a substrate of the semiconductor laser. The device is capable of deflecting or converting the wavelength of a laser light emitted from the semiconductor laser and thereafter emitting it as a modulated laser light. The composite optical modulator is useful in all sectors of optoelectronics including laser light modulators for use in digital copiers and laser printers, pickups for optical disks, and optical switches for optical communication and optical computers.

BACKGROUND OF THE INVENTION

Ferroelectrics, typical examples of which include perovskite $ABO_3$ type oxides, have many desirable properties including ferroelectricity, piezoelectricity, pyroelectricity, electrooptic effects and nonlinear optical effects. Taking these properties, ferroelectrics have many potential applications including nonvolatile memories, surface acoustic wave (SAW) devices, infrared pyroelectric devices, acoustooptic devices, electrooptic devices, and second harmonic generating (SHG) devices.

The use as optical modulators has been realized by bulk acoustooptic devices or bulk electrooptic devices that use conventional ceramics or single-crystal materials. However, they have the problems of large size and high drive voltage. Many applications to SHG devices, optical modulators and other devices that have thin-film lightguide structures have been reported. Examples thereof include optical modulators that have a Ti-diffusion single-crystal $LiNbO_3$ lightguide, the formation of a thin $Pb_{1-x}La_x(Zr_{1-y}Ti_y)_{1-x/4}O_3$ film on a sapphire substrate by vapor-phase growth, and the formation of a thin epitaxial lightguide film of $LiNbO_3$ on a single-crystal oxide substrate.

Examples of the optical modulators that have a Ti-diffusion single-crystal $LiNbO_3$ lightguide include an SHG device that depends for its operation on a Ti-diffusion single-crystal $LiNbO_3$ lightguide having a periodic domain inverted structure (K. Yamamoto et al., *J. Appl. Phys.*, vol. 70, p. 1947 (1991)), and an optical scanner that depends for its operation on the acoustooptic effect of a surface acoustic wave (Hatori et al., *Shinqaku Giho*, OQE88-139, p. 9 (1989)). Examples of the optical modulators having a thin-film lightguide include a total internal reflection (TIR) optical switch that depends for its operation on the electrooptic effect of a thin epitaxial lightguide film of $Pb_{1-x}La_x(Za_{1-y}Ti_y)_{1-x/4}O_3$ formed on a sapphire substrate (H. Adachi et al., *Jpn. J. Appl. Phys.*, vol. 24, Suppl. 24-2, p. 287 (1985)), and an optical deflector that depends for its operation on the acoustooptic effect of a surface acoustic wave which has such a structure that an oriented thin polycrystalline piezoelectric ZnO lightguide film is formed on a GaAs substrate (C. J. Lii et al., *IEEE J. Quantum Electronics*, QE-22.6, p. 868 (1986)).

However, the conventional optical modulators which have diffusion lightguides using single crystals and hybrid thin-film electrooptic devices that have thin-film lightguides formed on single-crystal oxide substrates are not completely satisfactory because of the low efficiency of optical coupling of semiconductor lasers and electrooptic devices. Thin-film lightguides have another problem in that because of their hybrid structure, there is a room for further size reduction and that their cost is too high to justify their commercial use.

For integration of ferroelectric optical modulators with semiconductor lasers, it is necessary that thin ferroelectric films be grown epitaxially on GaAs substrates. Epitaxial growth of ferroelectric films is indispensable for various reasons including the availability of single crystals, the complexity involved in fabricating lightguides using single crystals, and, particularly in the case of thin-film lightguides, the strict refractive index conditions for lightguide modes and the need to achieve lower optical loss to produce single-crystal grade characteristics. However, the epitaxial growth of thin ferroelectric films on GaAs has been difficult to accomplish for various reasons such as high growth temperature, mutual diffusion between GaAs and the ferroelectric material, and oxidation of GaAs.

Under these circumstances, the present inventors made studies on the provision of a GaAs capping layer that could be grown epitaxially on the GaAs substrate at low temperature, that would help the epitaxial growth of thin ferroelectric films and would also work as a diffusion barrier. As a result, they found MgO that could be grown epitaxially on GaAs (100) by excimer laser deposition at a temperature as low as 250° C. They even succeeded in forming the films of other substances such as $BaTiO_3$ on MgO by epitaxial growth. (See JP-A-6-151601, JP-A-6-151602, and U.S. Pat. application Ser. No. 08/172,209 filed on Dec. 23, 1993.) (The term "JP-A" as used herein means an unexamined published Japanese patent application.) The structures proposed were ferroelectrics of a tetragonal system in which the direction of polarization was perpendicular to the substrate surface and which had the following crystallographic relationships for $BaTiO_3$ on GaAs:

$BaTiO_3(001)//MgO(100)//GaAs(100)$ with in-plane directions being $BaTiO_3[100]//MgO[001]//GaAs[001]$.

The inventors also succeeded in fabricating structures using an $ABO_3$ type oxide ferroelectrics that had random in-plane directions but which were oriented with the following relationships:

$ABO_3(111)//MgO(111)//GaAs(100)$ or
$ABO_3(0001)//MgO(111)//GaAs(100)$. (See U.S. Pat. application Ser. No. 08/250,702 filed on May 27, 1994.)

SUMMARY OF THE INVENTION

An object of the present invention is to provide a compact, low-cost and high-efficiency optoelectronic device that is an integral combination of a semiconductor laser and an optical modulating device which is capable of emitting laser light produced by modulating the light from the semiconductor laser. The optoelectronic device comprises the semiconductor laser and the optical modulating device that has a thin ferroelectric lightguide film which is epitaxial or oriented with resect to the substrate of the semiconductor laser.

Other objects and effects of the present invention will be apparent from the following description.

The present inventors continued their studies on the possibility of fabricating a monolithic optical modulator characterized by integration with a semiconductor laser on the basis of the previously proposed technologies. As a result, they accomplished a composite optical modulator comprising a semiconductor laser integrated with a thin ferroelectric film that has an acoustooptic, electrooptic or nonlinear optical effect.

The present invention relates to, as a first embodiment, a composite optical modulator comprising a semiconductor laser having thereon an interposed buffer layer and an optical modulating device in this order, the optical modulating device comprising a thin ferroelectric lightguide film which is epitaxial or oriented with respect to a substrate of the semiconductor laser, the optical modulating device modulating a laser light launched from the semiconductor laser and thereafter emitting a modulated laser light.

The present invention also relates to, as a second embodiment, a composite optical modulator comprising:

a semiconductor substrate;

a semiconductor laser device having an active layer formed on a first region of the semiconductor substrate;

an epitaxial or oriented ferroelectric layer formed on a second region of the semiconductor substrate; and a buffer layer provided at an interface between the semiconductor substrate and the ferroelectric layer for controlling the epitaxial growth or orientation of the ferroelectric layer, a laser beam emitted from the active layer being coupled to the ferroelectric layer.

The active layer is preferably placed in a face-to-face relationship with the ferroelectric layer.

The present invention further relates to, as a third embodiment, a composite optical modulator comprising:

a semiconductor substrate;

a semiconductor laser device having an active layer formed on the semiconductor substrate;

an epitaxial or oriented ferroelectric layer formed on the semiconductor layer device; and a buffer layer provided at an interrace between the semiconductor layer device and the ferroelectric layer for controlling epitaxial growth or orientation of the ferroelectric layer, a laser beam emitted from the active layer being coupled to the ferroelectric layer.

DETAILED DESCRIPTION OF THE INVENTION

Figure 1:
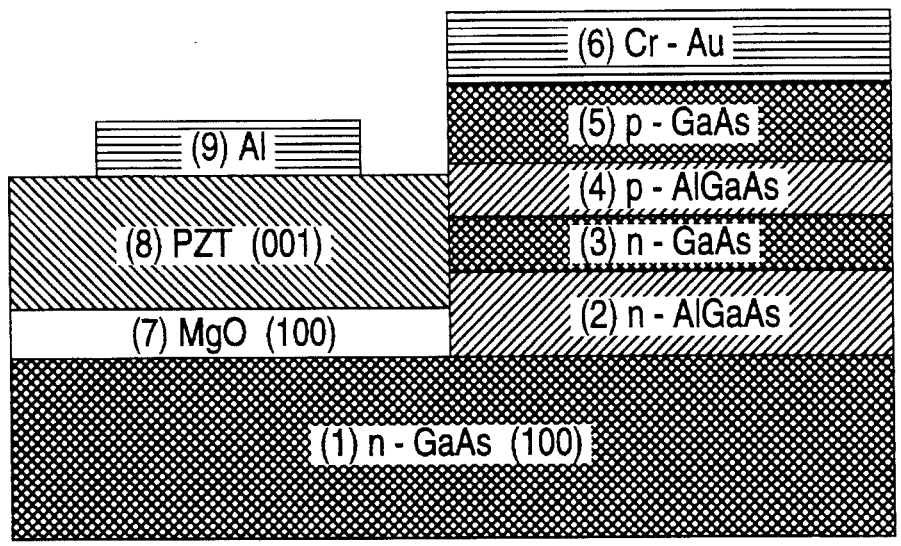
FIG. 1 is a schematic cross section of one embodiment a composite optical modulator of the present invention comprising a semiconductor laser and acoustooptic device combination that was fabricated in Example 1 by growing an epitaxial PZT on GaAs.

The composite optical modulator of the present invention comprises a semiconductor laser and a ferroelectric layer such as a thin $ABO_3$ type ferroelectric lightguide film that is epitaxial or oriented with respect to the semiconductor laser or the substrate of the semiconductor laser, and a laser light emitted from the semiconductor laser is modulated with the thin ferroelectric layer and then emitted as a modulated laser light.

The semiconductor laser to be used in the present invention can be fabricated by metal-organic chemical vapor deposition (MOCVD) or molecular beam epitaxy (MBE) of a material selected from among compound semiconductors, such as AlAs, AlSb, AlP, GaAs, GaSb, InP, InAs, InSb, AlGaP, AlInP, AlGaAs, AlInAs, AlAsSb, GaInAs, GaInSb, GaAsSb, and InAsSb, and II–VI series compound semiconductors, such as ZnS, ZeSe, ZnTe, CdSe, CdTe, HgSe, HgTe and CdS. Among these materials, GaAs and AlGaAs are in most cases preferred as major components.

The semiconductor laser used in the present invention fabricated by using the above materials can emit one or more laser spots (or beams). The use of more than one laser spot offers advantages such as permitting faster light deflection due to the acoustooptic effect to be described later and increasing the energy density of laser light exposure per unit area.

The epitaxial or oriented thin ferroelectric layer is formed on the compound semiconductor laser or the substrate of the semiconductor layer with a buffer layer being interposed. The buffer layer may be selected from among a thin MgO film, a thin $MgAl_2O_4$ film and multilayered thin films such as a $SrTiO_3$/MgO film, with the thin MgO film being particularly preferred.

Ferroelectrics have generally lower refractive indices than GaAs, but if the buffer layer is formed of a material such as MgO that has a lower refractive index than the ferroelectrics, the laser light can be confined within the thin ferroelectric layer, and the requisite thickness of the ferroelectrics is determined by the difference in refractive index.

For example, in the case where $SrTiO_3$ (n=2.399) is used as the substrate for epitaxial growth of $BaTiO_3$ ($n_0$=2.41 at 633 nm) and MgO (n=1.735) is used as the buffer layer, the minimum film thickness of $BaTiO_3$ that is theoretically necessary for producing a lightguide mode by prism coupling is 2023 nm for the TE1 mode (where the electric field is perpendicular to the surface and the phase difference in the lightguide is $2\pi$) if the substrate is made of $SrTiO_3$, whereas the minimum thickness of $BaTiO_3$ is only 232 nm if the MgO buffer layer is used as a substrate for the epitaxial growth.

In the case where PZT (n=2.63) is to be grown epitaxially on the same substrate, the minimum film thickness that is required theoretically for the TE1 mode is 398 nm if $SrTiO_3$ is used as the substrate, whereas it is only 192 nm if the MgO buffer layer is used as a substrate for the epitaxial growth.

That is, it is desired to select a material system having a large difference in refractive index, and a thin MgO film is particularly preferred as the buffer layer.

In the case where a thin MgO film is provided as the buffer layer, a thin $ABO_3$ type ferroelectric film of a tetragonal, orthorhombic or pseudo-cubic system can be formed assuming either one of the following crystallographic relationships:

$ABO_3$(001)//MgO(100)//GaAs(100) with in-plane directions being $ABO_3$[010]//MgO[001]//GaAs[001], $ABO_3$(100)MgO(100)//GaAs(100) with in-plane directions being $ABO_3$[001]//MgO[001]//GaAs[001], or $ABO_3$(111)//MgO(111)//GaAs(100) with random in-plane directions. A thin $ABO_3$ ferroelectric film of a hexagonal system can be formed assuming either one of the following crystallographic relationships:

$ABO_3$(0001)//MgO(100)//GaAs(100) with random in-plane directions, or $ABO_3$(0001)//MgO(111)//GaAs(100) with random in-plane directions.

Examples of the ABO$_3$ type oxide ferroelectrics include various ferroelectrics and substitution derivatives thereof, such as BaTiO$_3$, PbTiO$_3$, Pb$_{1-x}$La$_x$(Zr$_y$Ti$_{1-y}$)$_{1-x/4}$O$_3$ (which may be PZT, PLT or PLZT depending upon the values of x and y), Pb(Mg$_{1/3}$Nb$_{3/2}$)O and KNbO$_3$ for the tetragonal, orthorhombic or pseudo-cubic system, and LiNbO$_3$ and LiTaO$_3$ for the hexagonal system.

The buffer layer can be prepared by a vapor-phase growth process selected from among electron beam evaporation, flash evaporation, ion plating, Rf-magnetron sputtering, ion beam sputtering, laser ablation, molecular beam epitaxy (MBE), chemical vapor deposition (CVD), plasma-assisted CVD, MOCVD, etc. The thin ferroelectric film can be prepared by a vapor-phase growth process selected from among electron beam evaporation, flash evaporation, ion plating, Rf-magnetron sputtering, ion beam sputtering, laser ablation, MBE, CVD, plasma-assisted CVD, MOCVD, etc., as well as by a wet process such as a sol-gel method.

As the semiconductor substrate, those composed of a single-material semiconductor or a compound semiconductor can be used, with a compound semiconductor being preferred and a Ga-As substrate and InP substrate being more preferred. Examples of a single-material semiconductor include Si, Ge, and diamond. Examples of a compound semiconductor include III–V series semiconductors, such as AlAs, AlSb, AlP, GaAs, GaSb, InP, InAs, InSb, AlGaP, AlInP, AlGaAs, AlInSb, AlAsSb, GaInAs, GaInSb, GaAsSb, and InAsSb, and II–VI series compound semiconductors, such as ZnS, ZnSe, ZnTe, CaSe, CdTe, HgSe, HgTe, and CdS.

The laser light produced by operation of the semiconductor laser can be launched into the thin ferroelectric lightguide film by a suitable method selected from among evanescent coupling, butt coupling, grating coupling, etc. The launched laser light is emitted after optical switching, deflection or scanning, for example, by an acoustooptic effect of the index change due to a surface acoustic wave or by an electrooptic effect of the index change due to an applied electric field. Depending on the device used, the launched laser light may be emitted as a radiation that contains the second harmonic wave produced by the nonlinear optical effect. In the case of performing optical switching, deflection or scanning by the electrooptic effect, as well as in the case of a SHG device that is characterized by the pseudo-phase matching (periodic domain inversion) and operates on the nonlinear optical effect, electrodes made of a metal, a conductive oxide or the like may be provided on both the semiconductor laser and the thin ferroelectric film to form a sandwiched structure, which is generally preferred since it permits a greater decrease in drive voltage or applied voltage than common devices that have parallel electrodes provided on the surface of the thin ferroelectric film.

The following examples are provided for the purpose of further illustrating the present invention but are in no way to be taken as limiting.

EXAMPLE 1

FIG. 1 shows a schematic cross section of a composite optical modulator according to the present invention, in which both a semiconductor laser and an acoustooptical modulating (AOM) device are formed on a common compound semiconductor (n-GaAs) substrate to make an optical scanner. The right half of FIG. 1 is the semiconductor laser device which comprises the n-GaAs compound semiconductor 1 that has on a (100) face the following layers in superposition: a n-AlGaAs cladding layer 2, a n-GaAs active layer 3, a p-AlGaAs cladding layer 4, a p-GaAs ohmic contact layer 5, and a Cr-Al electrode 6. Laser operation is to be effected in the active layer 3. The semiconductor laser is designed to form two emission regions, or dual spots, in a direction perpendicular to the paper, and the regions other than the emission regions are rendered non-emitting by diffusing silicone. The left half of FIG. 1 comprises a MgO(100) buffer layer 7 and a ferroelectric PZT (001) film 8 that are formed in superposition on the common GaAs (100) 1 compound semiconductor substrate, with Al transducer electrodes 9 being provided on the PZT film 8. A plurality of Al electrodes 9 are spaced apart in a direction perpendicular to the paper and are connected to a transducer.

The active layer in the semiconductor laser forms a butt coupling, or a face of physical junction, with the thin ferroelectric film, so that the laser light emitted from the active layer is coupled into the ferroelectric film. The active layer and the ferroelectric film may or may not contact each other. A buffer layer may be provided at the interface between the active layer and the ferroelectric film.

The MgO buffer layer 7 enables the designing of such a hybrid structure and the buffer layer also enables the PZT (001) ferroelectric film to be formed on the n-GaAs substrate in either an epitaxial or highly oriented manner. The MgO buffer layer also functions as a cladding layer for confining light within the ferroelectric film.

The structural design adopted in Example 1 enables laser beam scanning by means of a complete solid device. The device will now be described in detail.

Using the epitaxial PZT (Zr/Ti=50/50) grown on the dual spot semiconductor laser, an optical scanner depending on double diffraction for its operation was fabricated and connected to a multitransducer capable of the acoustooptic (AO) effect. The dual spot semiconductor laser consisted of two independently drivable semiconductor lasers spaced apart by a distance of 10 µm. The two semiconductor lasers were fabricated by MOCVD growth of GaAs and AlGaAs in multiple layers and by the diffusion of Si in the areas other than the laser cavities. The MgO and PZT layers were formed by an Rf sputtering growth method. The MgO layer had a film thickness of 50 to 500 nm and the PZT layer had a film thickness of 100 to 600 nm. The crystallographic relationships of the respective layers were as follows:
PZT(001)//MgO(100)//GaAs(100) with in-plane directions being PZT[010]//MgO[001]//GaAs[001].

The composite optical modulator thus constructed had the lightguide of the semiconductor laser portion integrated in series with the lightguide of the thin-film ferroelectric optical modulating portion, so that the laser light produced by operation of the semiconductor laser would be launched via butt coupling into the thin ferroelectric lightguide film.

An optical modulating device depending on the AO effect for its operation consists basically of an ultrasonic wave source and an ultrasonic wave medium. The ultrasonic wave medium is required to have large values for refractive index n (a tensor of rank two) and a modulus of photoelasticity e (a tensor of rank four) but small values for density ρ, the velocity of ultrasonic wave v, and the absorption of ultrasonic wave. The overall physical properties of the ultrasonic wave medium are expressed by the following figure of merit M:

$$M = n^6 e^2 / \rho v^3 \tag{1}$$

The piezoelectric effect is expressed by the following general equations for electric polarization D and strain S, each of which is a function of electric field E and stress T:

$$D = dT + \epsilon^T E \quad (2)$$

$$S = s^E T + dE \quad (3)$$

where d is a piezoelectric coefficient, $s^E$ is a modulus of elasticity, and $\epsilon^T$ is a dielectric constant. The ultrasonic wave source operating on the piezoelectric effect is required to have high values for the piezoelectric coefficient d (a tensor of rank three) and an electromechanical coupling coefficient k (a tensor of rank three) by making use of the strain S in response to the applied electric field E.

Using a piezoelectric material that serves both as the ultrasonic wave source and as the ultrasonic wave medium is effective in thin-film devices and, hence, materials that have high values for the figure of merit M and the coupling efficiency k are desired. Under these circumstances, the PZT used in Example 1 and $LiNbO_3$ are two representative ferroelectrics that are preferably employed to exploit the piezoelectric effect.

Using the piezoelectric effect of the thin PZT film employed in Example 1, a surface acoustic wave (SAW) can be excited via the transducer. The surface acoustic wave (SAW) will change the refractive index of the thin film periodically and, hence, the laser light that is incident crossing the SAW to be coupled into the thin ferroelectric film will undergo the Bragg reflection due to the acoustooptic effect under Bragg's law expressed by equation (4):

$$m\lambda = 2\Lambda \sin \theta_B \quad (4)$$

where m is the number of orders of laser diffraction; $\lambda$ is the wavelength of the laser light; $\Lambda$ is the wavelength of the SAW; and $\theta_B$ is the Bragg angle (deflection angle×½).

In AO modulation, Bragg's law for reflection may also be expressed as follows:

$$Q = 2\pi\lambda L/n\Lambda d = 2\pi\lambda Lf/nv^2 > 1 \quad (5)$$

where L is the width of the SAW beam; f is the frequency of the SAW; and v is the velocity of the SAW. If Q<1, the Raman-Nath diffraction will occur.

In Example 1, the laser light was scanned by modulating the frequency of input to the transducer, which in turn caused a change in the wavelength of SAW and $\Lambda$, and hence a change in the Bragg angle $\theta_B$. This frequency sweep is generally performed by digital modulation and the frequency of the SAW crossing the incident laser beam width varies in suitable steps whereas the frequency of the SAW parallel to the laser beam width is constant. The angle of deflection in AO digital modulation is determined in the following manner. The wavelength of light in a medium having a refractive index of n is expressed as follows with reference to the wavelength of light in vacuum $\lambda_0$:

$$\lambda = \lambda_0/n \quad (6)$$

Rewriting equation (4) and substituting equation (6) into it, the deflection angle $2\theta_B$ can be expressed with respect to the primary incident light as follows:

$$\begin{aligned} 2\theta_B &= 2\sin^{-1}(\lambda/2\Lambda) = 2\sin^{-1}(\lambda_0/2n\Lambda) \\ &= 2\sin^{-1}(\lambda_0 f/2nv) = 2 \cdot \lambda_0 f/2nv \\ &= \lambda_0 f/nv \\ &(= \lambda_0/n\Lambda) \text{ (if } \theta_B \text{ is small)} \end{aligned} \quad (7)$$

A maximum deflection angle $2\theta_B$ that can be attained in the SAW frequency band $\Delta f$ is expressed as follows from equation (7):

$$2\Delta\theta_B = \lambda_0 \Delta f/nv \quad (8)$$

In the case of double diffraction as in Example 1, the deflection angle is increased by a factor of 2. In order to attain large values for the deflection angle, a tilt transducer may be used to increase the frequency and its bandwidth or a material may be selected that is low in refractive index and SAW velocity.

In addition to these methods, it is also effective to drive the frequency band as it is divided into sub-bands to which a plurality of transducers are assigned or to perform double diffraction as in Example 1.

In AO digital modulation, the spot diameter, the number of spots and the time for spot movement are determined in the following manner. If the width of a laser beam in the lightguide is written as $D_1$ and the focal length of the imaging lens as $F_1$, the spot diameter for diffraction limit $2\omega$ ($1/e^2$ diameter) is expressed by:

$$2\omega = (4/\pi) \cdot (\lambda \cdot F_1/D_1) \quad (9)$$

The number of spots from a resolving laser $N_d$ is expressed by:

$$N_d = 2\Delta\theta_B \cdot F/2\omega = (\pi/2) \cdot \tau \cdot \Delta f_d \quad (10)$$

where $\tau$ is the time required for the passage of SAW with respect to the laser beam width and if SAW is to be digitally modulated, $\tau$ is equivalent to the time for spot movement $t_d$ as expressed by equation (11). In order to shorten, the laser beam width may be reduced or a material of slow SAW velocity may be selected.

$$t_d = \tau = (D_1/v) \quad (11)$$

The number of spots from a resolving laser N may also be expressed as follows:

$$N_d = \Delta f_d/\delta f_d = \tau \cdot \Delta f_d \quad (12)$$

where $\Delta f_d$ is the SAW frequency bandwidth and $\delta f_d$ ($=1/\tau$) is the frequency change necessary for diffraction. The number of spots from a resolving laser $N_d$ may further be expressed as follows:

$$N_d = \Delta f_d/\delta f_d = \tau \cdot \Delta f_d = D_1/v \cdot \Delta f \quad (13)$$

Thus, the tim for spot movement is related to the number of spots in such a way that the latter will decrease if the former is reduced (the time for spot movement must be prolonged in order to increase the number of spots). For increasing the number of spots without changing the time for spot movement, it is effective to widen the bandwidth of the transducer. On the other hand, for shortening the time for spot movement and yet increasing the number of spots, it is effective to use a semiconductor laser that emits a plurality of laser beams as in Example 1.

When the SAW is subjected to analog modulation, its frequency changes continuously across the laser beam width and, hence, the SAW works as a Fresnel zone lens, causing the laser beam to be scanned and converged simultaneously. If T is written for the analog modulation time and $\Delta f_1$ for the analog SAW frequency bandwidth, the time for spot movement $t_1$ and the number of spots from a resolving laser $N_1$ are expressed by the following equations which state that the number of spots is not dependent on the time for spot movement unlike in the case of digital modulation:

$$t_1 = T/(\tau \cdot \Delta f_1) \quad (14)$$

$$N_1 = (T-\tau)/T \cdot (\tau \cdot \Delta f_1) \quad (15)$$

In order to increase the number of spots without changing the time for spot movement, the frequency bandwidth of the transducer must be increased. This means increasing the deflection angle but at the same time there arise a problem that need be considered. Diffraction efficiency η is approximated by the following equation:

$$\eta = \sin^2[\pi/4 \cdot I\{M \cdot P \cdot L/(d \cdot \lambda^2)\}^{1/2}] \quad (16)$$

where I is the multiple integral of the guided light and the SAW; M is the figure of merit of the thin lightguide film material; P is the power of the SAW; and L is the length of interaction between the guided light and the SAW. The problem here is that if the frequency of the SAW and the bandwidth of the sweep frequency are increased in order to increase the deflection angle or the number of resolved spots, the diffraction efficiency will decrease. For example, if a deflection angle is intended to be greater than 10°, the frequency of SAW must be increased to several gigahertz but then the absorption of SAW increases to lower the diffraction efficiency. If the frequency bandwidth of the transducer is increased in order to increase the bandwidth of the sweep frequency, the excitation efficiency of SAW and, hence, the diffraction efficiency will decrease. These problems, however, can be effectively dealt with by one of the approaches described above: driving over the necessary bandwidth as it is divided into sub-bands to which a plurality of transducers are assigned, or performing double diffraction as in Example 1.

Digital AO modulation was effected with the epitaxial thin-film PZT acoustooptic device that was integrated with a dual spot laser in Example 1. With the transducer being operated at a frequency band (Δf) of 1,000 MHz and the laser operating at a wavelength ($\lambda_0$) of 790 nm, the modulator exhibited the following performance in terms of θ (deflection or scan angle), t (time for spot movement), N (the number of spots) and 2ω (spot diameter):

θ=12° t=0.66 μs

N=2,600 spots

2ω=45 μm

The modulator of Example 1 was much smaller in size than optics using a polygonal mirror and a print test was conducted with this modulator incorporated into a laser beam printer. With the modulator drive conditions being set as above and with the laser performing interlaced scanning for the exposure of the photoreceptor, printing could be done at a density of 400 spots per inch and no noise was heard unlike in the case of printing with the optics using a polygonal mirror. The effective output efficiency of the emitted laser light as determined by the coupling and diffraction efficiencies of the laser light was 40%, which was higher than the value (30%) for the hybrid AO modulator.

EXAMPLE 2

Figure 2:
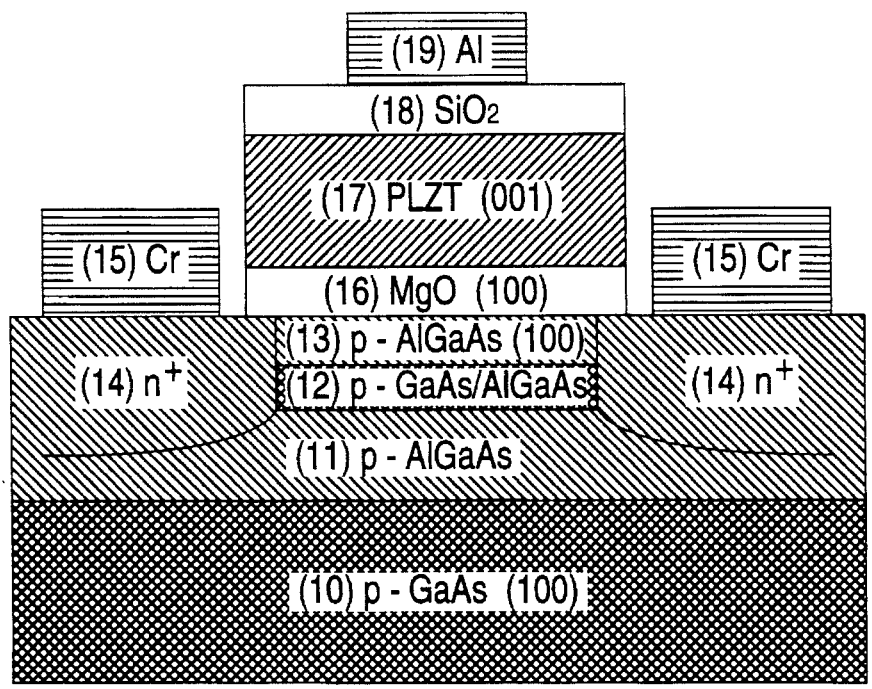
FIG. 2 is a schematic cross section of another embodiment of a composite optical modulator of the present invention comprising a semiconductor laser and electrooptic device combination that was fabricated in Example 2 by growing an epitaxial PLZT on AlGaAs.

FIG. 2 shows a schematic section of a composite optical modulator according to another embodiment of the present invention, in which a switching device is integrated on a semiconductor laser device. The lower part of FIG. 2 is the semiconductor laser device and the upper part is the switching (modulating) device. A p-GaAs (100) substrate 10 is overlaid, in superposition, with a p-AlGaAs cladding layer 11, a p-GaAs/AlGaAs active layer 12, and a p-AlGaAs cladding layer 13. A silicon-diffused heterojunction area n$^+$ 14 is formed on both sides of the p-AlGaAs layer 11 and Cr electrodes 15 are provided on both heterojunction areas 14 to complete the fabrication of the semiconductor laser portion, in which the active layer 12 is addressable from both sides. The p-AlGaAs(100) cladding layer 13 in the semiconductor laser portion is overlaid with a MgO(100) buffer layer 16, which enables an epitaxial or highly oriented ferroelectric PLZT (001) film 17 to be formed on the p-AlGaAs (100) face 13. The PLZT film 17 is overlaid with a light confining cladding layer SiO$_2$ 18, which is further overlaid with a switching device controlling Al electrode 19. In the arrangement shown in FIG. 2, the laser light emitted from the active layer 12 is evanescent field coupled into the ferroelectric PLZT film 17. The device of Example 2 will now be described in detail.

Using the epitaxial PLZT grown on the semi-conductor laser, a total reflecting device operating on the electrooptic (EO) effect was fabricated. The semiconductor laser was fabricated by MOCVD growth of GaAs and AlGaAs in multiple layers and by the diffusion of Si in the areas other than the laser cavity. The lightguide was formed in a shallow position 50 to 200 nm below the surface. The laser had no upper GaAs contact layer and electrons were injected from the lateral side of the heterojunction. The semiconductor laser was overlaid with the MgO and PLZT layers which were formed by a laser ablation growth method. The MgO layer had a film thickness of 2 to 200 nm and the PLZT layer had a film thickness of 200 to 700 nm. The crystallographic relationships of the respective layers were as follows:
PLZT(001)//MgO(100)//AlGaAs(100) with in-plane directions being PLZT[010]//MgO[001]//AlGaAs[001].

The laser light produced by operation of the semiconductor laser was launched into the thin ferroelectric lightguide film by evanescent field coupling due to the optical tunnelling which was realized by optimizing the MgO layer between the lightguide in the laser portion and the lightguide in the thin-film ferroelectric optical modulating portion. When performing optical switching by the electrooptic effect, an electrode formed of a metal or a conductive oxide may be provided either on the thin ferroelectric film or on both the semiconductor laser and the thin ferroelectric film to produce a sandwiched structure for driving.

When an electric field is applied to a given material, polarization will generally develop in the direction of the applied field and the velocity of light in that direction will decrease. Considering that light which travels in vacuum at a velocity of c will propagate at a velocity of v through a medium having a refractive index of n and a relative dielectric constant $\epsilon_r$, the following relationship will hold:

$$n = c/v = (\epsilon_r \mu_r)^{1/2} \quad (17)$$

This results in the development of an electrooptic effect, according to which the refractive index will increase in the direction of the applied field but decrease in a direction perpendicular to the applied field. In this electrooptic effect, the relationship between the refractive index n and the applied electric field E is given by:

$$n = n_0 + aE + bE^2 + cE^3 + \ldots \quad (18)$$

With a crystal structure having a center of symmetry, the following two equations must be equal:

$$n = n_0 - aE + bE^2 - cE^3 + \ldots \quad (19)$$

$$n = n_0 + aE + bE^2 + cE^3 + \ldots \quad (20)$$

Hence, $$n = n_0 + bE^2 + \ldots \quad (21)$$

and the terms of odd orders are eliminated from the change in refractive index due to the applied electric field as shown below:

$$\Delta n = n_0 - n = -bE^2 - \ldots \quad (22)$$

The term of second order on the right-hand side of equation (22) is called the Kerr effect and generally expressed as follows:

$$\Delta n = -\tfrac{1}{2} R n^3 E^2 \quad (23)$$

With a crystal structure having no center of symmetry, on the other hand, the terms of odd orders will remain:

$$\Delta n = n_0 - n = -aE - bE^2 - \ldots \quad (24)$$

The term of first order on the right-hand side of equation (24) is called Pockel's effect and generally expressed as follows:

$$\Delta n = -\tfrac{1}{2} r n^3 E \quad (25)$$

Pockel's effect develops only in substances that have crystal structures without a center of symmetry, namely, piezoelectrics and ferroelectrics. In practice, an increasing electric field is accompanied by an index change that is characterized by the progressive superposition of the Kerr effect on Pockel's effect.

To exploit this electrooptic effect, a ferroelectric material is used that has a crystal structure without a center of symmetry but has a high coefficient for the electrooptic effect, as represented by the PLZT used in Example 2 or $LiNbO_3$. Another important requirement to be satisfied in the case under consideration is to select a material whose I-E characteristic in the electrooptic effect has no memory quality. To this end, it is necessary to select a material that is characterized by a slim P-E hysteresis loop and which, in practice, has no memory quality in the I-E characteristic. A matrix of coefficients for the electrooptic effect is a tensor of rank three.

When a local electric field is applied to a ferroelectric material as in the form of the thin PLZT film used in Example 2, the refractive index of the affected area will decrease in the manner described above and the laser light can be switched or deflected either by the Bragg reflection of the nature described in Example 1 or by the total reflection which occurs in Example 2.

Total reflection occurs if the following condition for total reflection is satisfied:

$$\theta T \geq \sin^{-1}(n_2/n_1) \quad (26)$$

where $\theta T$ is the incident angle (critical angle), $n_1$ is the refractive index of the lightguide material, and $n_2$ is the refractive index of the area where the index drop occurred. In equation (26), $n_1$ must be smaller than $n_1$. If the index drop is due to the Kerr effect which is generally expressed by equation (23) stating that An $\Delta n = -\tfrac{1}{2} R n^3 E^2$. Hence, equation (26) is rewritten as:

$$\theta T = \sin^{-1}(n_2/n_1) = \sin^{-1}\{(n_1 - \Delta n)/n\} \quad (27)$$
$$= \sin^{-1}(1 + 1/2Rn^2E^2)$$

The electrooptic (EO) modulation is not limited by the time for phonon movement as in the case of SAW but it is solely dependent on polarization and, hence, the time required for spot movement (switching time) is as fast as on the order of picoseconds.

With the laser operating at a wavelength ($\lambda_0$) of 790 nm, the epitaxial thin-film PLZT electrooptic device that was integrated with the laser in Example 2 exhibited the following performance in terms of θ (deflection angle) and t (switching time):

θ=4° t=50 ps

The device was combined with optics using a polygonal mirror and a print test was conducted with the resulting modulator incorporated into a laser beam printer. With the laser performing interlaced scanning for the exposure of the photoreceptor, printing could be done at a density of 600 spots per inch and the print speed was twice as fast as in the case of printing with the optics using the polygonal mirror.

The modulator of Example 2 was only a few times as large as the semiconductor laser and its size could be reduced to a fraction of the size of the conventional hybrid electrooptic device. When performing optical switching by the electrooptic effect, the electrode formed of a metal or a conductive oxide was provided either on the thin ferroelectric film or on both the semiconductor and the thin ferroelectric film to produce a sandwich structure and, hence, the device could be driven with a much lower voltage than was required for commonly applied devices that have parallel electrodes provided on the surface of the thin ferroelectric film.

EXAMPLE 3

Figure 3:
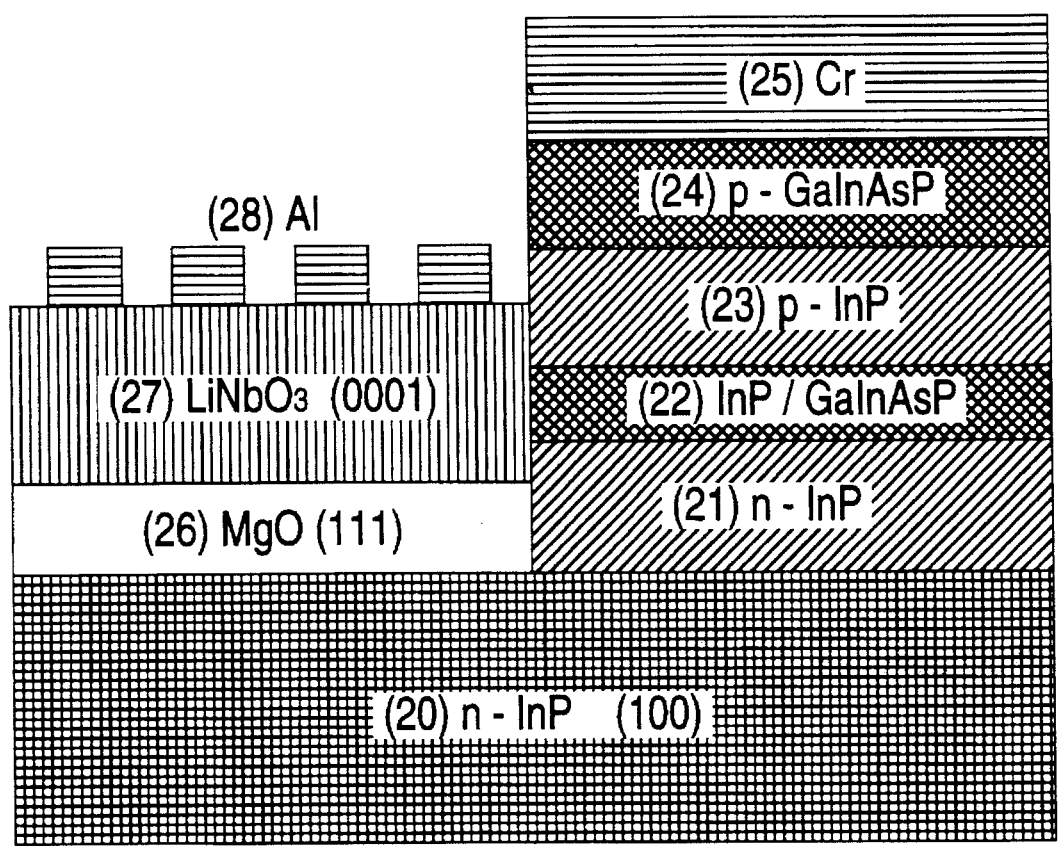
FIG. 3 is a schematic cross section of further embodiment of a composite optical modulator of the present invention comprising a semiconductor laser and SHG device combination that was fabricated in Example 3 by growing oriented $LiNbO_3$ on InP.

FIG. 3 shows a schematic cross section of a composite optical modulator according to further embodiment of the present invention, in which a semiconductor laser device and a SHG device are provided on a common compound semiconductor n-InP (100) substrate 20. The right half of FIG. 3 is the semiconductor laser device which comprises the n-InP compound semiconductor that has on a (100) face the following layers in superposition: a n-InP cladding layer 21, an InP/GaInAsP active layer 22, a p-InP cladding layer 23, a p-GaInAsP ohmic contact layer 24, and a Cr electrode 25. Laser operation is to be effected in the active layer 22. The left half of FIG. 3 comprises a MgO (111) layer 26 and a ferroelectric $LiNbO_3$(0001) film 27 that are formed in superposition on the common n-InP (100) compound semiconductor substrate, with a plurality of Al segment electrodes 28 being provided on top of the $LiNbO_3$ film 27. The active layer in the semiconductor layer forms a butt coupling, or a face of physical junction, with the thin ferroelectric film, so that the laser light emitted from the active layer is coupled into the ferroelectric film. The active layer and the ferroelectric film may or may not contact each other. A buffer layer may be provided at the interface between the active layer and the ferroelectric film. The MgO buffer layer 26 enables the designing of such a hybrid structure and buffer layer also enables the ferroelectric LiNbO (0001) film to be formed on the n-InP substrate in either an epitaxial or highly oriented manner. The MgO buffer layer also functions as a cladding layer for confining light within the ferroelectric film. The device of Example 3 will now be described in detail.

Using the oriented $LiNbO_3$ grown on the semi-conductor laser, a visible laser device depending on pseudo-phase matched (periodic domain inversed) second harmonics for its operation was fabricated. The semiconductor laser had the InP/InGaAsP active layer that was formed by MOCVD and which emitted laser light at a wavelength of 1,327 μm. The MgO and $LiNbO_3$ layers were prepared by a laser ablation growth process. The MgO layer had a film thickness of 100 to 500 nm and the LinNbO$_3$ layer had a film thickness of 100 to 700 nm. The crystallographic relationships of the respective layers were as follows: LiNbO$_3$(0001)// MgO(111)//InP(100) with random in-plane directions. After the growth of the liNbO$_3$ layer, Al was evaporated on the thin LiNbO$_3$ film and a voltage of 200 to 400 kV/cm was applied at a given temperature between the substrate of the semiconductor laser and the Al electrode, whereby poling was performed in surface of the thin LiNbO$_3$ film as it was rendered a single +c face. Subsequently, the Al electrode was patterned by etching at a period ($\Lambda$) of 13 µm and pulses of 100 µs were applied at a voltage of 250 kV/cm between the substrate of the semiconductor laser and the Al electrode, whereby the domains in the thin LiNbO$_3$ film were inversed at periods of 13 µm. The lightguide in the laser portion was connected in series to the lightguide in the thin-film ferroelectric optical modulating portion and the laser light produced by operation of the semi-conductor laser was launched into the thin-film ferroelectric lightguide by butt coupling.

For pseudo-phase matching, the following condition must be satisfied:

$$k_{2\omega}-2k_\omega-2\pi(2m_1-1)/\Lambda=0 \qquad (28)$$

where $k_{2\omega}$ and $2k_\omega$ are wave number vectors for harmonics and the fundamental wave, respectively; and $m_1$ is a positive integer.

If $\Lambda$ satisfies this condition for pseudo-phase matching, $\Lambda/2$ will be an even multiple of the coherent length as follows:

$$\Lambda/2=(2m_1-1)L \qquad (29)$$

wherein the coherent length L is expressed by the following equation:

$$L=\lambda_\omega/4\{n_{2\omega}-n_\omega\} \qquad (30)$$

where $\lambda\omega$ is the wavelength of the fundamental wave in vacuum, and $n_{2\omega}$ and $n_{1o7}$ are the effective refractive indices of the lightguide for harmonics and the fundamental wave, respectively. Substituting equation (30) into equation (29), period $\Lambda$ can be rewritten as follows:

$$\begin{aligned}\Lambda &= 2(2m_1-2)L = 2(2m_1-1) \cdot \lambda_\omega/4\{n_{2\omega}-n_\omega\} \qquad (31)\\ &= m_2\lambda_\omega/2n_\omega\end{aligned}$$

where $m_2$ is a positive integer.

The visible laser device fabricated in Example 3 depended on pseudo-phase matched second harmonics for its operation and used the oriented LiNbO$_3$ grown on the semiconductor laser. The semiconductor laser itself emitted laser light at a wavelength of 327 µm but on account of pseudo-phase matching, light at a wavelength of 0.662 µm could be emitted from the visible laser device at an efficiency of 6%/Wcm$^2$ with respect to the incident light. Compared to the conventional Ti-diffused SHG device which used single-crystal LiNbO$_3$, the device of Example 3 was small in size and produced an increased efficiency of coupling with the laser light, thereby permitting second harmonics to produce greater effective outputs.

As stated in the foregoing, the present invention enables an optical modulating device to be integrated with a semiconductor laser and many advantageous features such as compactness, low cost, high efficiency, high speed operation, and low noise level can be realized compared to the prior art hybrid solid devices and optical modulators having moving parts. Hence, if the composite optical modulator of the present invention is incorporated in a digital copying machine or a laser printer and used as a device for modulating laser light, the above advantages, i.e., compactness, low cost, high speed operation, and lower noise level can be accomplished. If the same modulator is used as a pickup for optical disks, the same advantages can also be accomplished. In the general optoelectronic fields including optical switches for optical communication and optical computers, similar advantages such as compactness, the same advantages can be realized by using the composite optical modulator according to the present invention.

In the case where the composite optical modulator of the present invention is used in optical switching, deflection, or scanning by the electrooptic effect, as well as where it is used as a SHG device that is characterized by the pseudo-phase matching (periodic domain inversion) due to the nonlinear optical effect, an electrode made of a metal or a conductive oxide may be provided on both the semiconductor laser and the thin ferroelectric film to form a sandwiched structure, which permits a greater decrease in drive voltage or applied voltage than conventional devices that have parallel electrodes provided on the surface of the thin ferroelectric film.

While the present invention has been described in detail and with reference to specific examples thereof, it will be apparent to one skilled in the art that various changes and modifications can be made therein without departing from the spirit and scope thereof.

What is claimed is:

1. A composite optical modulator comprising:

a semiconductor substrate;

a semiconductor laser device having an active layer formed on a first region of said semiconductor substrate;

an epitaxial or oriented ferroelectric layer formed on a second region of said semiconductor substrate; and a buffer layer provided at an interface between said semiconductor substrate and said ferroelectric layer for controlling the epitaxial growth or orientation of said ferroelectric layer, a laser beam emitted from said active layer being coupled to said ferroelectric layer.

2. A composite optical modulator as claimed in claim 1, wherein said active layer is placed in a face-to-face relationship with said ferroelectric layer.

3. A composite optical modulator as claimed in claims 1, wherein said composite optical modulator further comprises an electrode on said ferroelectric layer.

4. A composite optical modulator as claimed in claim 1, wherein said semiconductor substrate is a compound semiconductor (100) substrate and wherein said buffer layer comprises MgO (100).

5. A composite optical modulator as claimed in claim 1, wherein said semiconductor substrate is a compound semiconductor (100) substrate and said buffer layer comprises MgO (111).

6. A composite optical modulator as claimed in claim 3, wherein said electrode and said ferroelectric layer combine to form an electrooptic effect generating device.

7. A composite optical modulator as claimed in claim 6, wherein said electrooptic effect is an acoustooptic effect.

8. A composite optical modulator as claimed in claim 6, wherein said electrooptic effect is a second harmonic generating effect.

9. A composite optical modulator comprising:

a semiconductor substrate;

a semiconductor laser device having an active layer formed on said semiconductor substrate;

an epitaxial or oriented ferroelectric layer formed on said semiconductor laser device; and a buffer layer provided at an interface between said semiconductor laser device and said ferroelectric layer for controlling epitaxial growth or orientation of said ferroelectric layer, a laser beam emitted from said active layer being coupled to said ferroelectric layer.

10. A composite optical modulator as claimed in claim 9, said composite optical modulator further comprises an electrode on said ferroelectric layer.

11. A composite optical modulator as claimed in claim 9, wherein said substrate is a compound semiconductor (100) substrate; said semiconductor laser device comprises a cladding layer, said active layer, and a cladding layer (100) that are formed on said substrate; and said buffer layer comprises MgO(100) provided on said cladding layer (100).

12. A composite optical modulator as claimed in claim 9, wherein said electrode and said ferroelectric layer combine to form an electrooptic effect generating device.

\* \* \* \* \*